United States Patent [19]
Wang

[11] Patent Number: 5,880,009
[45] Date of Patent: Mar. 9, 1999

[54] METHOD FOR FORMING OXIDES ON BURIED N+-TYPE REGIONS

[75] Inventor: Lin-Song Wang, Hsinchu, Taiwan

[73] Assignee: Winbond Electronics Corp., Taiwan

[21] Appl. No.: 812,426

[22] Filed: Mar. 6, 1997

[30] Foreign Application Priority Data

Feb. 24, 1997 [TW] Taiwan ................................. 86102204

[51] Int. Cl.$^6$ ................................................. H01L 21/76
[52] U.S. Cl. ........................... 438/452; 438/439; 438/262
[58] Field of Search .................................. 438/452, 257, 438/262, 263, 439

[56] References Cited

U.S. PATENT DOCUMENTS 4,551,910  11/1985  Patterson .................................. 438/452
5,147,813   9/1992  Woo ........................................ 438/263
5,571,736  11/1996  Parterson et al. ........................ 438/262
5,637,528   6/1997  Higashitani et al. .................... 438/452

Primary Examiner—Trung Dang
Attorney, Agent, or Firm—Fish & Richardson P.C.

[57] ABSTRACT

A method for forming oxides on buried N+-type regions in a memory cell fabrication process, suitable for forming oxides on the bury N+-type regions before self-aligned MOS device etching, comprises: (1) implanting a high concentration of impurity into the buried N+-type regions; (2) annealing the chip; and (3) executing a dry oxide process and then a wet oxidation process to the chip, thereby preventing damage to the edges of buried N+-type regions caused by non-uniform thickness of oxides on buried regions during self-aligned MOS etching and resolving the problem of non-uniform oxides on buried N+-type regions.

9 Claims, 7 Drawing Sheets

METHOD FOR FORMING OXIDES ON BURIED N+-TYPE REGIONS

BACKGROUND OF THE INVENTION

1. Field of the invention

The invention relates to a semiconductor process and, in particular, to a method for forming oxides on buried N+-type regions in a flash memory cell fabrication process in order to provide an etching stop function during self-aligned MOS device etching.

2. Description of the Prior Art

Referring to FIG. 1, a memory cell includes field oxides 10, first poly-silicon layers 12 and second polysilicon layers 14 formed in order using a conventional flash memory cell manufacturing process. Then, self-aligned MOS etching is performed on the second poly-silicon layers 14, thereby forming floating gates. Furthermore, oxides (not shown) are formed on buried N+-type regions 16 (hereafter BN) which serve as etching stop regions during the above-mentioned self-aligned MOS etching.

In the conventional process, in order to prevent damage caused by etching, extremely thick oxides having an etching stop function are formed on doped regions of high concentration. The doped regions are formed by increasing the impurity concentration of BN regions through ion implantation, raising the temperature to about 900° C., and annealing the substrate with buried N+-type regions for about 60 minutes. The oxides are deposited in a high temperature vapor environment for about 20 minutes wet. The principle of forming extremely thick oxides on doped regions of high concentration is described in "Thermal Oxidation of Heavily Doped Silicon" disclosed by B. E. Deal et al. and "Thermal Oxidation of Heavily Phosphorus-Doped Silicon" disclosed by C. P. Ho et al.

However, in a sub-micron semiconductor fabrication process, since the area of a BN region 16 is only about 0.6 $\mu m \times 0.6\ \mu m$ as shown in FIG. 1 and the two sides of the BN region define the edges of the field oxides, the birds beaks 23a, 23b of field oxides 22a and 22b on the substrate 20 shown in FIG. 2 cover a part of the regions to be doped during ion implantation so that the dopant concentration on the two sides of a BN region is less than the dopant concentration in the center. As a result, the oxide on the center part of a BN region is thicker than those on the two sides of the BN region, resulting in the BN region at the edges of the field oxides 22a and 22b being too readily etched during subsequent etching, thereby creating a trench 24 as shown in FIG. 2.

SUMMARY OF THE INVENTION

Based on the above, the object of the invention is to provide a method for forming oxides with uniform thickness and an etching stop function on BN regions and thereby to prevent damage caused by etching.

The method for forming oxides on the BN regions during memory cell manufacture according to the invention comprises: implanting a high concentration of impurity into BN regions; annealing the substrate with the BN regions; and executing dry oxidation and then wet oxidation, thereby forming thicker and more uniform oxides on the BN regions. It can be clearly understood based on the above description that the invention provides an additional dry oxidation step between the annealing and wet oxidation step to completely resolve the problem of non-uniform thickness of the oxides on the BN regions.

BRIEF DESCRIPTION OF THE DRAWINGS

The objects, characteristics, and advantages of the present invention will be explained using a preferred embodiment with pertinent drawings as follows.

DETAILED DESCRIPTION OF THE INVENTION

Figure 1:
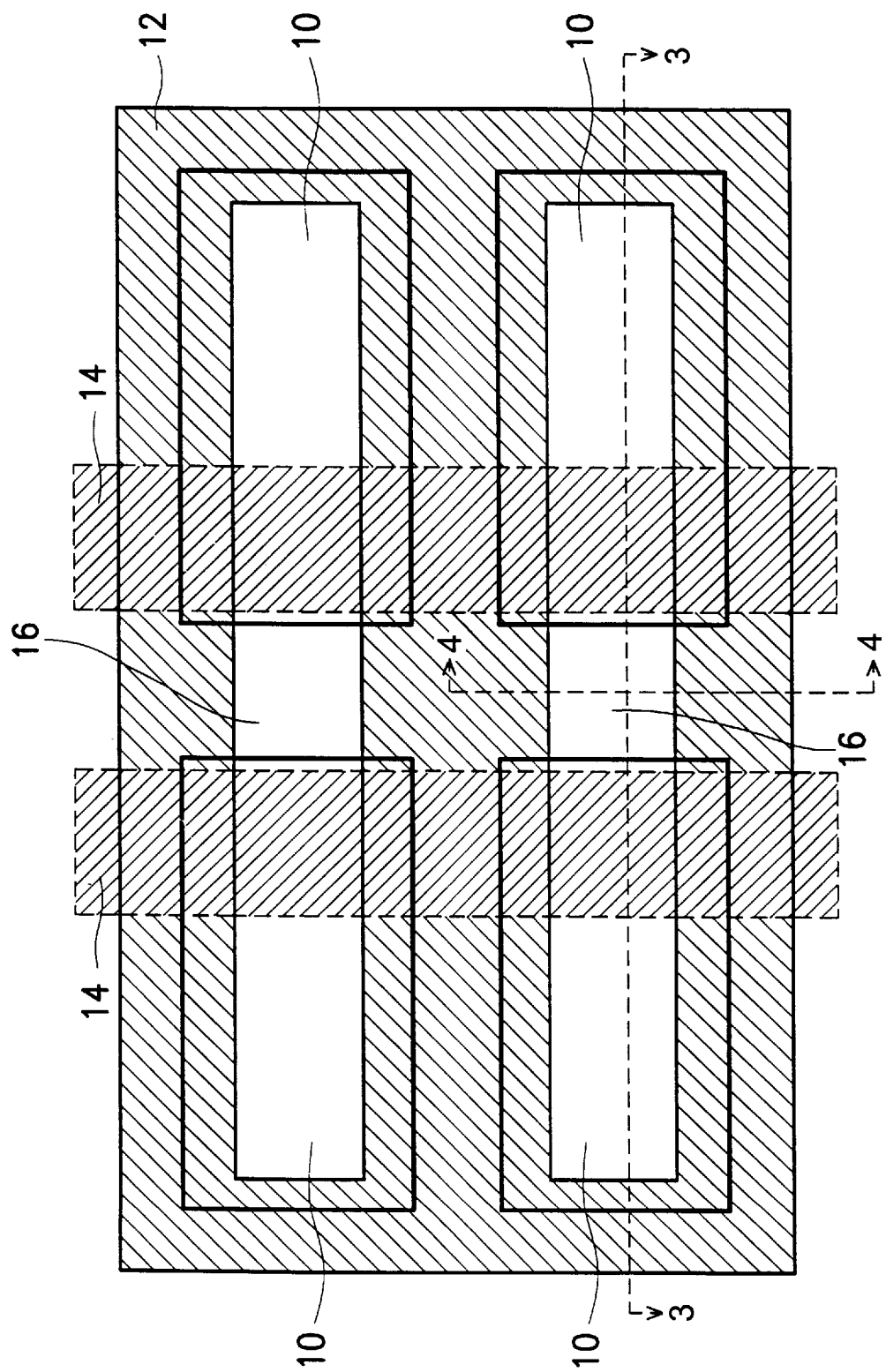
FIG. 1 is a top view illustrating memory cells according to the prior art.
Figure 2:
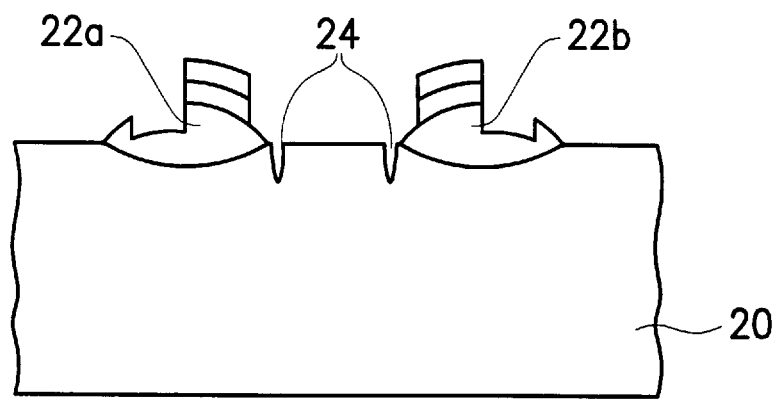
FIG. 2 is a cross-sectional view illustrating devices after etching according to the prior art.
Figure 3A:
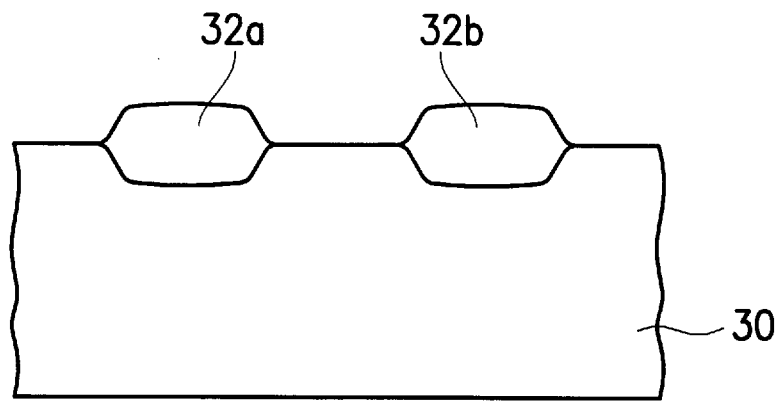
FIGS. 3a–f is a cross-sectional views illustrating a method for forming oxides on buried N+-type regions during memory cell manufacture according to an embodiment of the invention.
Figure 3B:
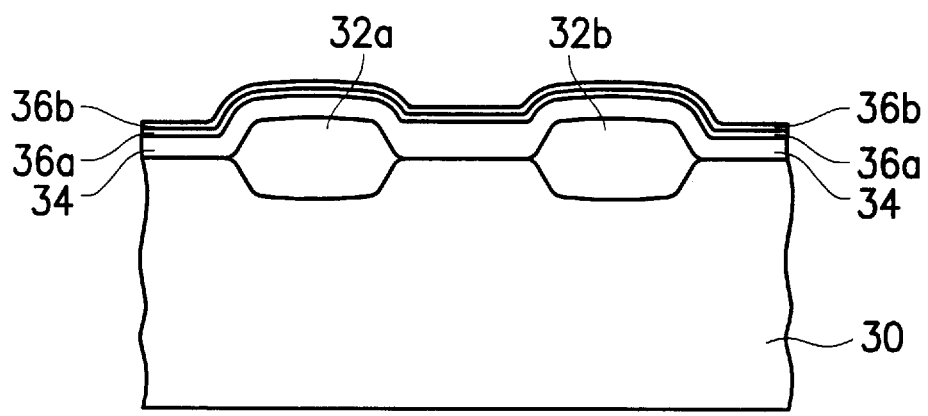
Figure 3C:
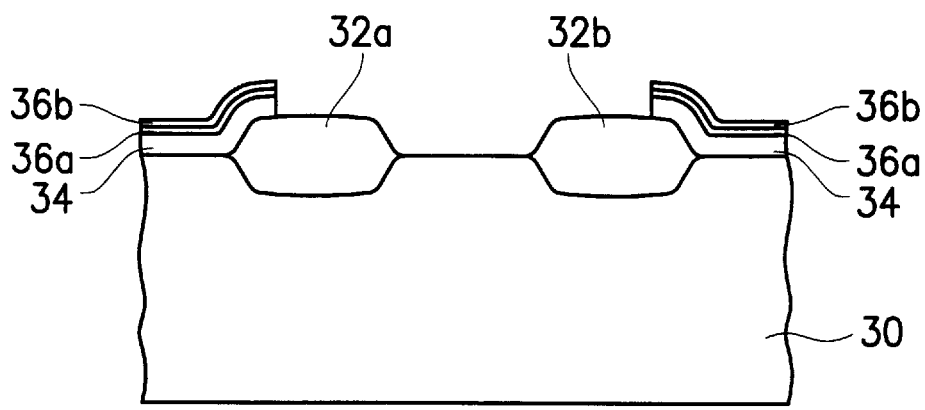
Figure 3D:
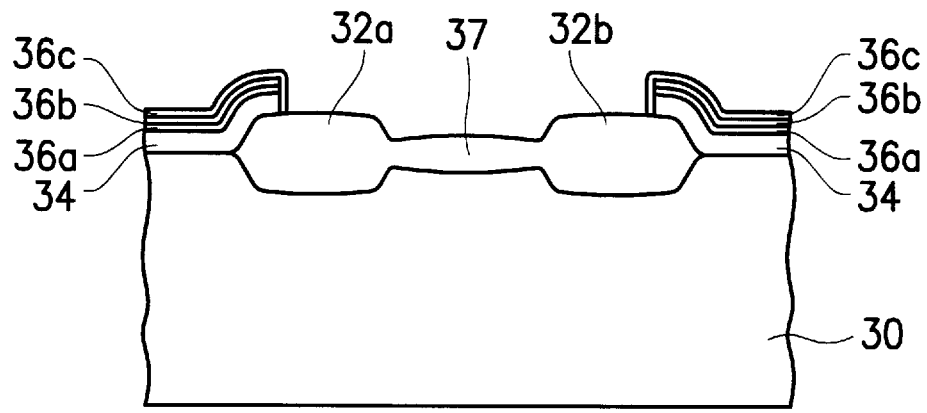
Figure 3E:
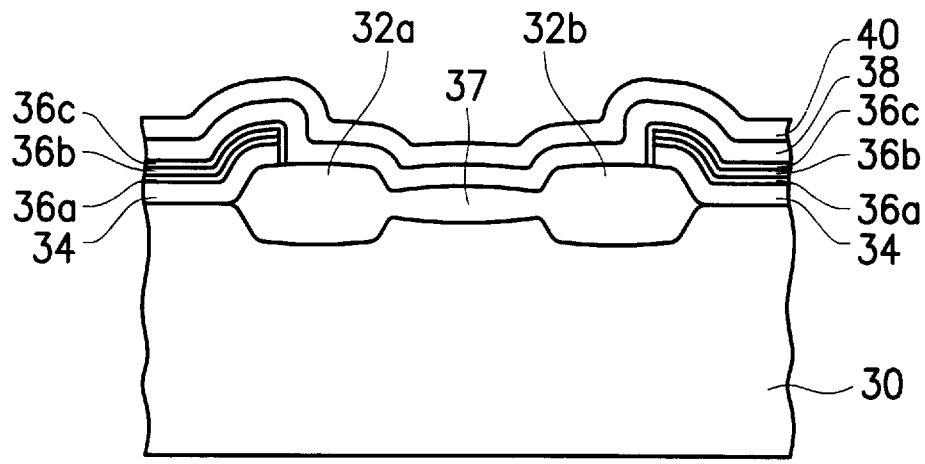
Figure 3F:
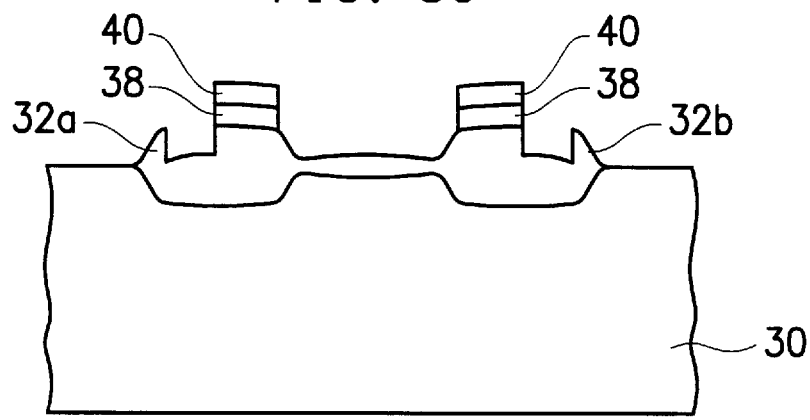
Figure 4A:
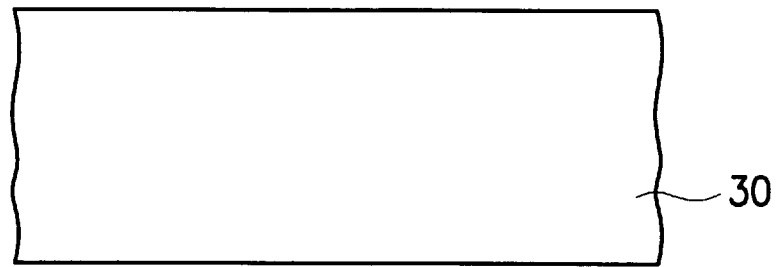
FIGS. 4a–f are cross-sectional views from a different perspective illustrating a method for forming oxides on buried N+-type regions during memory cell manufacture according to an embodiment of the invention.
Figure 4B:
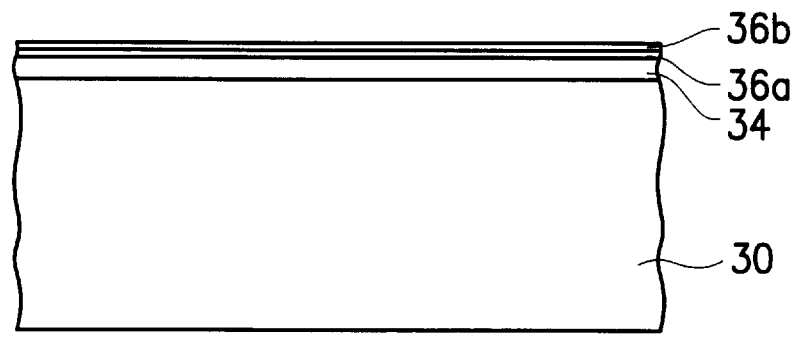
Figure 4C:
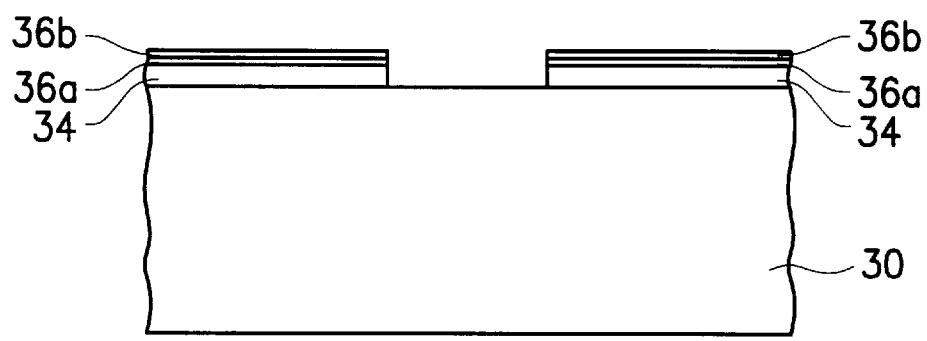
Figure 4D:
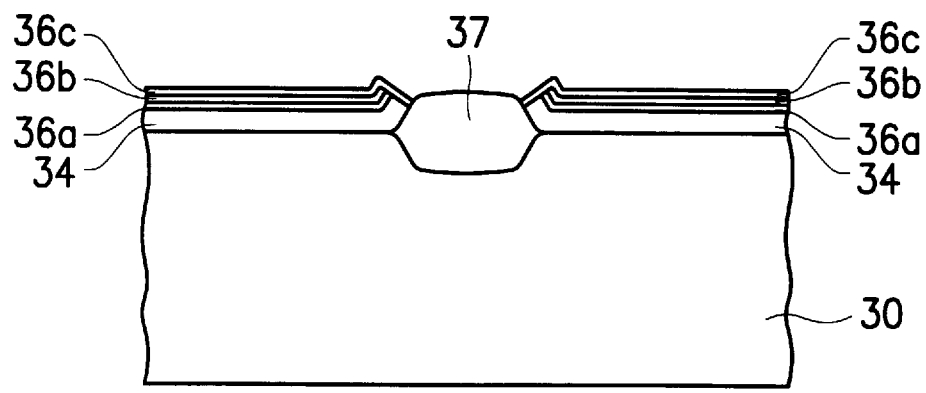
Figure 4E:
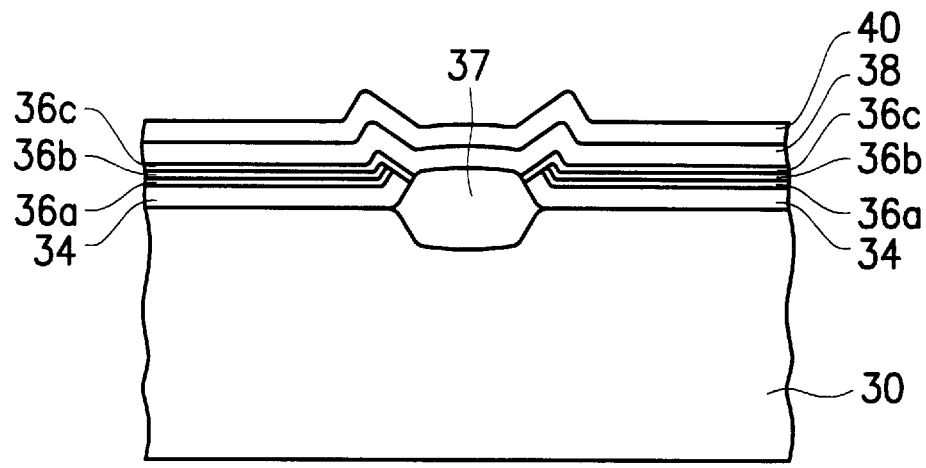
Figure 4F:
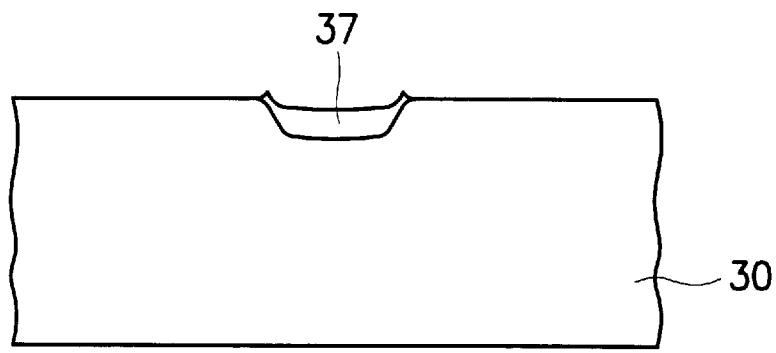

A method for forming oxides on buried N+-type regions during memory cell manufacture according to an embodiment of the invention will be described hereinafter, accompanied by two cross-sectional views along two different directions wherein the two cross-sectional views along a dotted line 3—3 and a dotted line 4—4 respectively include FIGS. 3a to 3f and FIGS. 4a to 4f. The above-referenced method for forming oxides on buried N+-type regions during memory cell manufacture comprises: (1) simultaneously forming field oxides 32a and 32b to a thickness of about 6,500 Å on a substrate 30 as shown in FIG. 3a and FIG. 4a; (2) forming a first poly-silicon layer 34 to a thickness of about 1,000 Å over the substrate 30 and oxides 32a and 32b, depositing a first thermal oxide layer 36a over first poly-silicon layer 34 to a thickness of about 60~100 Å, and then depositing a nitride layer 36b over first thermal oxide layer 36a to a thickness of about 90–150 Å as shown in FIG. 3b and FIG. 4b; (3) defining a floating gate region 35 by an etching step, and then implanting arsenic ions at a concentration in a range between about 5E15/cm³ and about 7E15/cm³ and an energy level between about 30 KeV and about 50 KeV into the floating gate region 35 as shown in FIG. 3C and FIG. 4C; (4) depositing a second thermal oxide layer 36c over the first polysilicon layer 34, first thermal oxide layer 36a, and nitride layer 36b to a thickness of about 60–100 Å, thereby forming an oxide-nitride-oxide (ONO) structure of dielectric layer together with the above-referenced first thermal oxide layer 36a and nitride layer 36b, and forming an oxide layer 37 with a uniform thickness on the doped floating gate region 35 as shown in FIG. 3d and FIG. 4d; (5) depositing a second poly-silicon layer 38 to a thickness of about 1,500 Å and a TEOS layer 40 to a thickness of about 1,000 Å in succession over second thermal oxide layer 36c and field oxides 32a, 32b as shown in FIG. 3e and FIG. 4e; (6) referring to FIG. 3f and FIG. 4f, forming floating gates (not shown) by a self-aligned etching step.

Figure 5:
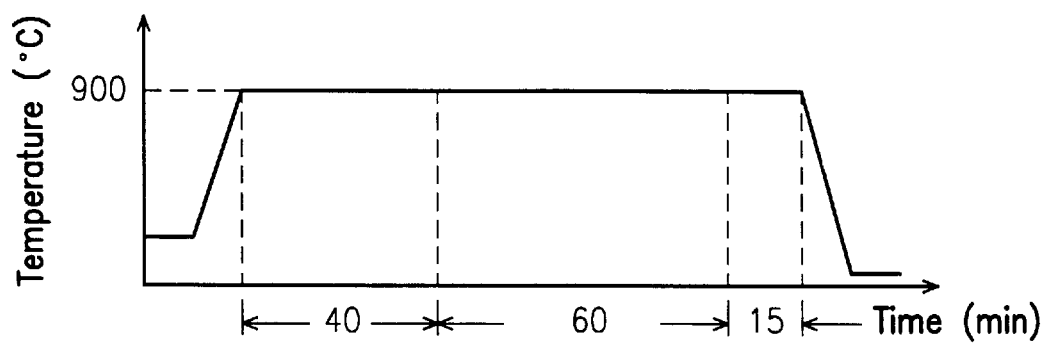
FIG. 5 is a graph illustrating the relationship between time and temperature during the formation of oxides on buried N+-type regions.

In the above-described process, the chip is first placed in pure nitrogen gas and annealed after a high concentration of impurity implanted. Then a thermal oxidation process is executed to the chip. Referring to FIG. 5, a graph illustrating the relationship between time and temperature during the formation of oxides on a buried N+-type region is shown.

Moreover, during the annealing and a thermal oxidation processes, the temperature is maintained at about 900° C., wherein the annealing process continues for about 40 minutes, the dry oxidation process continues for abut 60 minutes, and the wet oxidation process continues for about 15 minutes.

What is claimed is:

1. A method for forming oxides on buried $N^+$-type regions formed within a semiconductor substrate, before performing self-aligned MOS etching, comprising:

(1) implanting a high concentration of impurity into said buried $N^+$-type regions;

(2) annealing the substrate with the buried $N^+$-type regions; and (3) executing dry oxidation, and then executing wet oxidation, thereby forming thicker and more uniform oxides on said buried $N^+$-type regions.

2. The method for forming oxides on buried $N^+$-type regions as claimed in claim 1, wherein said annealing step is executed for about 40 minutes.

3. The method for forming oxides on buried $N^+$-type regions as claimed in claim 1, wherein said annealing step is performed at a temperature of about 900° C.

4. The method for forming oxides on buried $N^+$-type regions as claimed in claim 1, wherein said dry oxidation step is executed for about 60 minutes.

5. The method for forming oxides on buried $N^+$-type regions as claimed in claim 1, wherein said dry oxidation step is performed at a temperature of about 900° C.

6. The method for forming oxides on buried $N^+$-type regions as claimed in claim 1, wherein said wet oxidation step is executed for about 15 minutes.

7. The method for forming oxides on buried $N^+$-type regions as claimed in claim 1, wherein said wet oxidation step is performed at a temperature of about 900° C.

8. The method for forming oxides on buried $N^+$-type regions as claimed in claim 1, wherein said impurity is arsenic ions.

9. The method for forming oxides on buried $N^+$-type regions as claimed in claim 1, wherein said implanting step further comprises implanting said impurity at a concentration in a range between about $5E15/cm^3$ and about $7E15/cm^3$ and an energy in a range between about 30 KeV and about 50 KeV.

* * * * *